(12) United States Patent
Shimoyama

(10) Patent No.: US 6,356,473 B1
(45) Date of Patent: Mar. 12, 2002

(54) STATIC RANDOM ACCESS MEMORY (SRAM)

(75) Inventor: Takato Shimoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/602,937

(22) Filed: Jun. 23, 2000

(30) Foreign Application Priority Data

Jun. 24, 1999 (JP) ............................ 11-177854

(51) Int. Cl.[7] ........................... G11C 15/00; G11C 16/04
(52) U.S. Cl. ..................................... 365/49; 365/189.04
(58) Field of Search ............................. 365/49, 189.01, 365/189.04, 154, 189.05, 230.01, 230.08

(56) References Cited

U.S. PATENT DOCUMENTS

| | | | | |
|---|---|---|---|---|
| 5,748,558 A | * | 5/1998 | Suzuki | 365/233 |
| 5,757,704 A | * | 5/1998 | Hachiya | 365/189.07 |
| 6,026,031 A | * | 2/2000 | Porter et al. | 365/189.05 |
| 6,064,624 A | * | 5/2000 | Pawlowski | 365/230.06 |

FOREIGN PATENT DOCUMENTS

| | | |
|---|---|---|
| JP | 1-241089 | 9/1989 |
| JP | 5-74162 | 3/1993 |
| JP | 8-222000 | 8/1996 |

* cited by examiner

*Primary Examiner*—Richard Elms
*Assistant Examiner*—Anh Phung
(74) *Attorney, Agent, or Firm*—Darryl G. Walker

(57) ABSTRACT

According to one embodiment, an asynchronous static random access memory (SRAM) circuit (100) can provide reduced power consumption and high-speed access. An SRAM circuit (100) may include address registers (122 and 128) that can store a write address from one write operation and output the stored write address during a subsequent write operation. A data register (138) may also be included that can store write data from one write operation and output the stored write data during a subsequent write operation. Memory cells of a memory cell array (102) may be selected according to a pulse word signal PW. A pulse word signal PW can be generated in response to transitions in an address and transitions in a write enable signal /WE. Hit address comparators (220) within address registers (122 and 128) in combination with a hit AND gate (136) can activate a HIT ALL signal when a stored write address matches an applied read address. When the HIT ALL signal is activated, an output circuit (118) can output stored write data instead of an output from a sense amplifier circuit (116).

13 Claims, 7 Drawing Sheets

STATIC RANDOM ACCESS MEMORY (SRAM)

TECHNICAL FIELD

The present invention relates generally to static random access memory (SRAM) circuits, and more particularly to approaches for reducing current consumption in SRAM circuits.

BACKGROUND OF THE INVENTION

Static random access memory (SRAM) circuits are highly valued in many applications due to their relatively fast access speeds. However, such fast access speeds typically come at the cost of increased current consumption and hence increased power consumption. With the advent of portable electronic devices, it has become an increasingly important goal to manufacture integrated circuits that consume less power. Thus, an increasingly important goal in SRAM circuit design has been to find ways to decrease the current and/or power consumption of such circuits, while maintaining relatively fast operating speeds.

SRAM circuits can typically include a number of SRAM memory cells. One particular type of SRAM memory cell is the six transistor (6-T) memory cell. One example of a 6-T memory cell is shown in FIG. 9. The 6-T memory cell of FIG. 9 is includes a pair of driver transistors Tr1 and Tr2 having cross-coupled gate-drain connections at nodes N1 and N2. Access transistors Tr3 and Tr4 can connect nodes N1 and N2 to digit lines D and /D. A 6-T memory cell may further include a pair of load devices. In some configurations, load devices can include transistors, while in other configurations load devices can include resistors. FIG. 9 illustrates an example of a 6-T memory cell with transistors Tr5 and Tr6 as load devices.

It is noted that while memory cells that include resistors as load devices are often referred to as "4-T" memory cells, to avoid confusion with "true" 4-T memory cells discussed in more depth below, such four transistor, two resistor-type memory cells will also be considered 6-T cells for the purposes of this discussion.

The gates of access transistors Tr3 and Tr4 can be connected to a word line WL. Load devices (Tr5 and Tr6) can be connected between nodes N1 and N2 and a high power supply voltage. Driver transistors (Tr1 and Tr2) can have source-drain paths connected between nodes N1 and N2 and a low power supply voltage.

SRAM circuits may select memory cells for access (e.g., a read or write operation) in a variety of ways. One type of access is provided by "true" asynchronous SRAM circuits. A true asynchronous SRAM circuit can operate in response to applied input signals, and not in response to an external timing signal, such as a periodic clock signal. In many applications, true asynchronous SRAM circuits timing is based on a transition in an applied address value.

An example of a true asynchronous SRAM circuit operation is shown in FIG. 10. FIG. 10 is a timing diagram showing an address value ADD, a chip select signal /CS, a write enable signal /WE, a data input value DIN, and an indication of selected word line values (SEL WL). In FIG. 10, a chip select signal /CS and write enable signal /WE can be active (low in this case) and the address can make a transition. A data value (DATA) that is to be written can also be entered.

In response to the address transition, a word line WL and digit line pair (D and /D) can be selected. The input data (DATA) may then be written into the memory cell selected by the word line and digit line pair (D and /D).

A drawback to such an arrangement is that a memory cell can remain selected while the write enable signal /WE is active. During such a time period, a current can flow through a digit line from a de-selected memory connected to the same word line. Such a current can contribute to overall current consumption in a SRAM circuit.

Another drawback to a conventional true asynchronous SRAM circuit is the timing constraints that may be presented by such circuits. In particular, a true asynchronous SRAM circuit that is undergoing a write operation to one address may undergo a subsequent transition to a second address. To prevent the write data from being erroneously written into the second address, a SRAM circuit may include a specification TWR that indicates a minimum time between the termination of a write enable (/WE) pulse and a subsequent address transition. Such a TWR specification is shown in FIG. 10. A TWR requirement may increase the overall time required to access an SRAM cell, thus decreasing the operating speed of the SRAM device.

A second type of asynchronous SRAM circuit can operate internally in a similar fashion to a synchronous SRAM devices. Namely, internal timing pulses can be generated to control read and/or write operations. However, unlike a synchronous SRAM circuit, such internal timing pulses are not generated in response to an externally applied periodic signal, but instead are generated in response to various transitions in other applied input signals. One such type of SRAM circuit can be referred to as a "pulse" word system. In a pulse word system, a memory cell can be selected at the particular time the read and write operations are taking place. More particularly, a pulse word system can generate timing pulses in response to transitions in address values and in response to transitions in write data values.

An example of a pulse word SRAM circuit operation is shown in FIG. 11. FIG. 11 is a timing diagram showing an address value ADD, a chip select signal /CS, a write enable signal /WE, a data input value DIN, and an indication of selected word line values (PW). In FIG. 11, a chip select signal /CS can be active (low in this case) while a write enable signal is inactive (high). In addition, the address can make a transition to a value A0. In response to the address transition, a pulse word signal (PULSE WL) can be activated, and data can be read from a memory cell corresponding to address A0.

Next, a write enable signal can be activated (transition low) while the chip select signal /CS is active (low) indicating a write operation. Further, an address can transition from an A0 value to a value A1. FIG. 11 particularly shows a "long" write operation where write data values may transition one or more times while a write enable signal is active. Consequently, a memory cell at address A1 can be written to essentially multiple times.

In the above arrangement, because a memory cell is selected when the pulse word signal is active, the period of time during which a memory cell is selected can be less than that of a true asynchronous SRAM circuit. Consequently, current consumption can be reduced over a true asynchronous SRAM circuit approach.

Various examples of pulse word SRAM circuits are shown in Japanese Unexamined Patent Publication No. Hei 1-241089, Japanese Unexamined Patent Publication No. Hei 5-74162, and Japanese Unexamined Patent Publication No. Hei 8-222000.

However, as noted above, in a pulse word SRAM circuit a "long" write operation can take place. In a long write case, a pulse word signal (PW) can be generated for each transition in the write data. Consequently, the amount of time that a memory cell remains selected can be increased, essentially defeating the current saving features of a pulse word SRAM circuit. Still further, as the number of write data transitions increases, more current can be consumed.

It is further noted that a pulse word SRAM circuit may introduce time constraints between operations. More particularly, when a write operation occurs in a pulse SRAM, a precharge operation may be required before a subsequent read operation is performed. A precharge operation can precharge digit lines prior to a read operation. Thus, in a pulse word SRAM, reading may have to be postponed until after a precharge operation. This can reduce the overall operating speed of a pulse SRAM circuit.

While many conventional SRAM circuits include 6-T memory cells as previously described, in recent years a more compact memory cell has been proposed in an effort to provide higher density SRAM devices. The proposed memory cell is a "true" four transistor (4-T) memory cell. A true 4-T memory cell can omit the load devices (e.g., transistors or resistors) present in a 6-T memory cell.

One example of a 4-T memory cell is shown in FIG. 12. The 4-T memory cell of FIG. 12 is shown to include a pair of driver transistors NMOS1 and NMOS2 having cross-coupled gates-drain connections at nodes N1 and N2. Driver transistors (NMOS1 and NMOS2) can be n-channel insulated gate field effect transistors (IGFETs). Access transistors PMOS1 and PMOS2 can connect nodes N1 and N2 to digit lines D and /D. Access transistors (PMOS1 and PMOS2) can be p-channel IGFETs.

The gates of access transistors (PMOS1 and PMOS2) can have gates that are connected to a word line. Driver transistors (NMOS1 and NMOS2) can have source-drain paths connected between nodes N1 and N2 and a low power supply voltage.

In a 4-T memory cell, data may be retained by supplying power to a digit line (D or /D) through a precharging circuit (not shown). With power supplied to a digit line, a sub-threshold leakage current can pass across the source-drain path of an access transistor (PMOS1 of PMOS2) and thereby maintain a corresponding storage node (N1 or N2) at a high potential. In this way, data values can be maintained by a precharge operation.

While 4-T memory cells can provide for denser memory cell arrays, incorporating such memory cells into conventional SRAM circuit architectures can be problematic. For example, using a 4-T memory cell in a true asynchronous SRAM circuit described above, may lead to loss of data. In particular, when a word line is activated, a 4-T memory cell that is not connected to a selected column (e.g., its corresponding digit line pair is not selected) can have its nodes connected to digit lines, one of which can be at a relatively low potential. If a charged (high) node is connected to a digit line at a low power supply level by its corresponding access transistor, the charged node can be discharged, thereby destroying the data stored in the memory cell. For these reasons, it has been difficult to implement 4-T memory cells in a true asynchronous SRAM circuit.

In light of the above discussion, it would be desirable to arrive at a SRAM circuit that can reduce current consumption over conventional approaches but maintain relatively fast access speeds.

Further, it would also be desirable to arrive at an asynchronous SRAM circuit that can include 4-T memory cells.

SUMMARY OF THE INVENTION

According to the disclosed embodiments, an asynchronous static random access memory (SRAM) circuit may store write data provided in one write cycle, and then write the stored write data to a selected memory cell on a subsequent write cycle.

According to one aspect of the embodiments, a SRAM circuit may include a memory cell array with a number of SRAM cells that are selected according to a received address. The SRAM may further include address registers that can store a write address value during one write cycle, and then provide the stored write address value on a subsequent write cycle.

According to another aspect of the embodiments, the SRAM may include an address transition detector that can detect a change in the received address and generate a timing pulse in response thereto. The timing pulse can be used to generate timing signals to read data from and write data to the SRAM.

According to another aspect of the embodiments, the SRAM may include a write data register that can store write data during one write cycle to an address. If a read operation is subsequently performed to the same address, the stored write data can be provided as the read data.

According to another aspect of the embodiments, a SRAM circuit may store write data at the end of a write enable signal, preventing the unnecessary selection of memory cells during a long write operation in which write data values may change more than once during the write operation.

According to another aspect of the embodiments a SRAM circuit may generate internal timing signals that are not based on a synchronous external timing signal. Further, such timing signals can generate pulse word signals that can be used to read and write data. The SRAM circuit may further include a number of SRAM cells that are "true" four transistor (4-T) memory cells. Such true 4-T memory cells can include two driver transistors having gate-drain connections that are cross-coupled to storage nodes, as well as two access transistors that connect the storage nodes to a digit line pair.

According to one aspect of the embodiments, the true 4-T memory cells can include driver transistors that are n-channel transistors and access transistors that are p-channel transistors.

DETAILED DESCRIPTION OF THE EMBODIMENTS

The present invention will now be described in detail with reference to a number of drawings.

Figure 1:
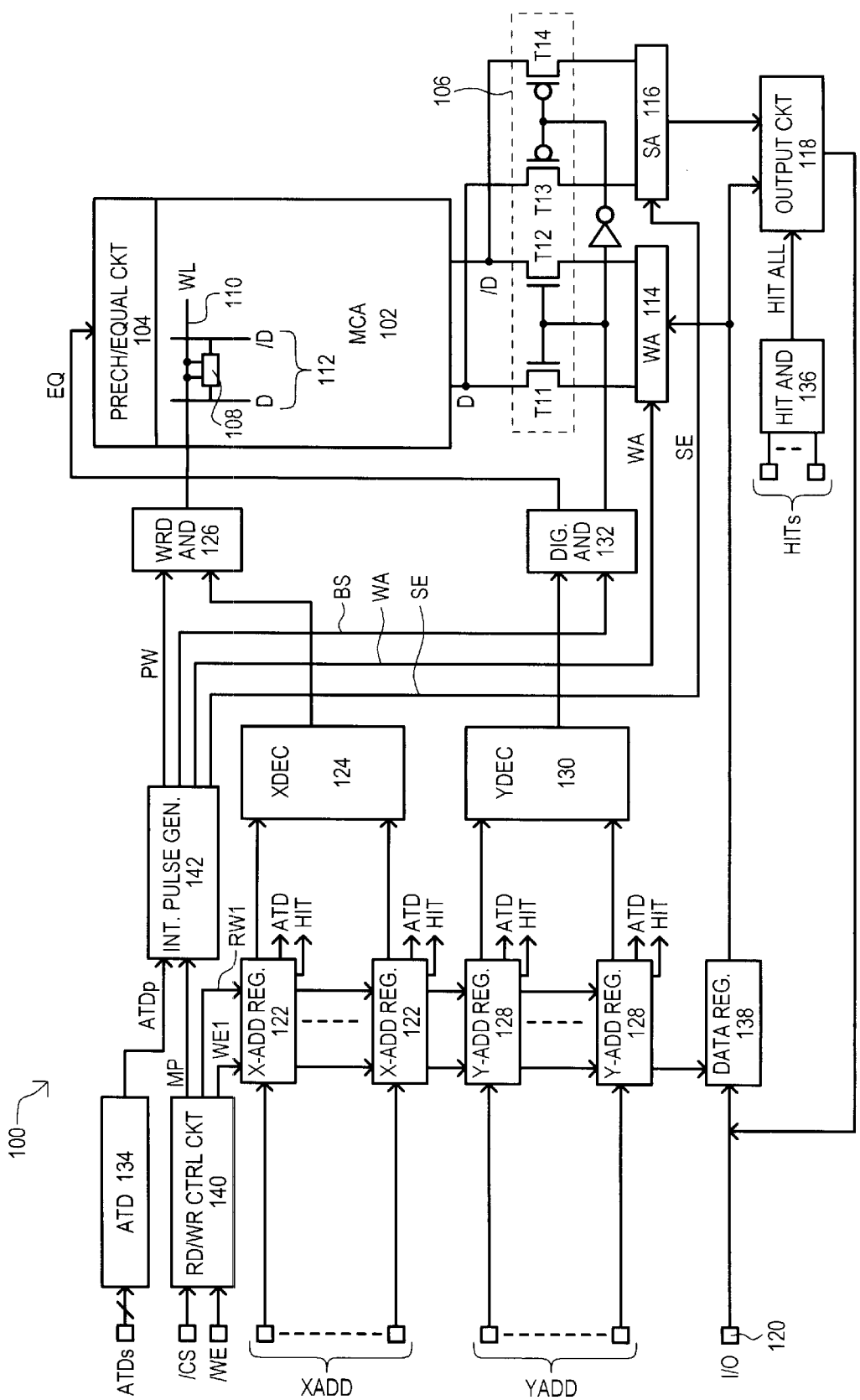
FIG. 1 is block diagram of a static random access memory (SRAM) circuit according to one embodiment of the present invention.
Figure 9:
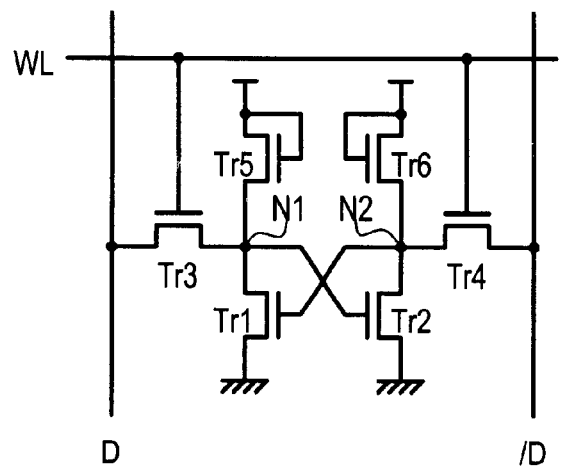
FIG. 9 is a schematic diagram of a six transistor SRAM memory cell.
Figure 10:
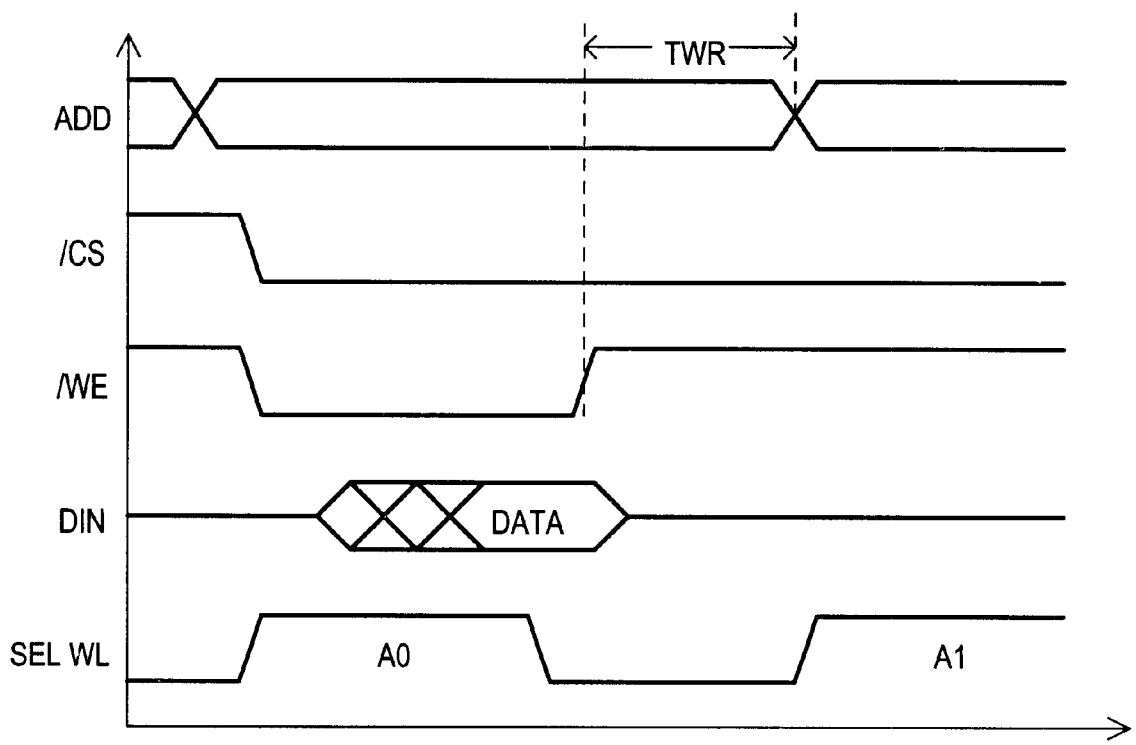
FIG. 10 is a timing diagram illustrating the operation of a conventional true asynchronous SRAM circuit.
Figure 11:
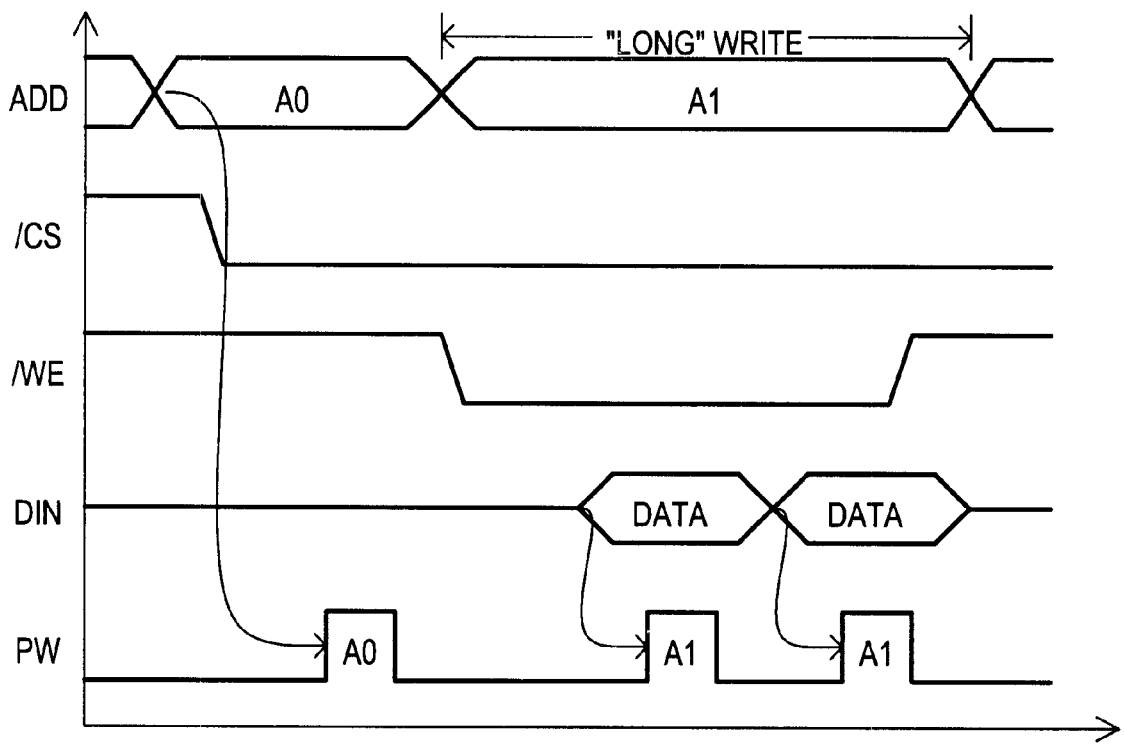
FIG. 11 is a timing diagram illustrating the operation of a conventional pulse word SRAM circuit.
Figure 12:
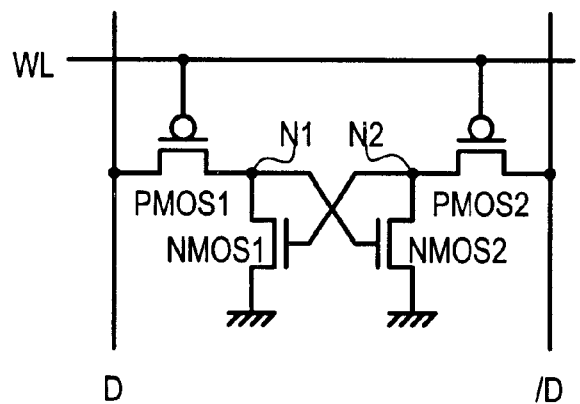
FIG. 12 is a schematic diagram of a four transistor SRAM memory cell.

Referring now to FIG. 1, a block diagram is set forth illustrating a static random access memory (SRAM) circuit according to one embodiment of the present invention. The SRAM circuit is designated by the general reference character 100 and is shown to include a memory cell array (MCA) 102 that can be connected to a precharge/equalization circuit 104 and a column switch circuit 106. In the particular example of FIG. 1, a memory cell array 102 may include a number of six transistor (6-T) memory cells, such as that shown in FIG. 9. One memory cell is shown by way of example in FIG. 1 as item 108, and may be connected to a word line 110 and a digit line pair (D and /D) 112. Digit line pairs (such as 112) within memory cell array 102 may be connected to a precharge/equalization circuit 104 and column switch circuit 106.

A precharge/equalization circuit 104 may precharge digit line pairs in a precharge operation. Such a precharge operation can precharge digit line pairs to a high supply voltage, a low supply voltage, or some intermediate voltage therebetween. A column switch circuit 106 may select particular digit line pairs to access particular memory cells (such as during a read or write operation). In the particular arrangement of FIG. 1, a column switch circuit 106 may include a number of column select transistors (T11, T12, T13 and T14). In the particular arrangement of FIG. 1, select transistors T11 and T12 can be n-channel insulated gate field effect transistors (IGFETs) that provide a write data path while select transistors T13 and T14 can be p-channel IGFETs that provide a read data path. Of course, such column select transistors (T11 to T14) could be of the same conductivity type in other embodiments.

A SRAM circuit 100 may also include a write amplifier circuit 114 and a sense amplifier circuit 116. A write amplifier circuit 114 can receive a write data value, amplify such a write data value, and supply it to a memory cell selected by column switch circuit 106 and an activated word line. A sense amplifier circuit 116 can receive read data on a pair of digit lines, amplify such read data, and supply it to an output circuit 118. The particular example of FIG. 1, an input/output (I/O) terminal 120 can receive write data and provide read data.

A particular word line may be selected according to an X-address (XADD), and a particular digit line pair may be selected according to a Y-address (YADD). The particular SRAM circuit 100 of FIG. 1 includes an X-address register 122 corresponding to each bit of an X-address. An X-address stored in registers 122 can be provided to an X-decoder circuit 124. X-decoder circuit 124 can decode an X-address and provide an X-select signal to a corresponding word AND gate, one of which is shown as item 126.

The particular SRAM circuit 100 of FIG. 1 also includes a Y-address register 128 corresponding to each bit of a Y-address. A Y-address stored in registers 128 can be provided to a Y-decoder circuit 130. A Y-decoder circuit 130 can decode a Y-address and provide a Y-select signal to a corresponding digit AND gate, one of which is shown as item 132.

As also shown in FIG. 1, each X-address register 122 and Y-address register 128 can provide an address transition detect signal (ATD), as well as a "hit" signal (HIT). The various ATD signals can be provided to an ATD circuit 134. Further, the various HIT signals can be provided to a hit AND gate 136.

A SRAM circuit 100 according to one embodiment may further include a data register 138. A data register 138 may be situated between an I/O terminal 120 and a write amplifier circuit 114. The data register 138 may also be situated between the I/O terminal 120 and an output circuit 118. In a write operation, write data may be input to a write amplifier circuit 114 by way of data register 138.

However, data from a data register 138 may also be provided as an input to output circuit 118. Further, the operation of an output circuit 118 can be controlled by hit AND gate 136. In particular, when hit AND gate 136 provides one output value, an output circuit 118 can provide read data from a sense amplifier circuit 116. However, when hit AND gate 136 provides another output value, output circuit 118 can provide the data stored in data register 138 as an output value.

SRAM circuit 100 further includes a read/write control circuit 140. A read/write control circuit 140 can receive a write enable signal /WE and a chip select signal /CS. In response to the /WE and /CS signals, a read/write control circuit 140 can output an internal write enable signal WE1, a read/write switch signal RW1, and a main pulse signal MP. The internal write enable and read/write switch signals (WE1 to RW1) can be provided to the X-address registers 122 and Y-address registers 128. Further, the internal write enable signal WE1 can also be provided to data register 138.

A main pulse signal MP can be a one-shot pulse that is generated in response to transition in a write enable signal.

An internal pulse generator 142 can receive the main pulse signal MP and an ATD pulse (ATDp) from ATD circuit 134. In response to various inputs, internal pulse generator 142 can output a pulse word signal PW, a block select signal BS, a sense amplifier enable signal SE, and a write amplification activation signal WA.

A pulse word signal PW can be provided as one input to word AND gates 126. Another input to word AND gates 126 can be an X-select signal from X-decoder circuit 124. The output of word AND gates 126 can then select a particular word line.

A block select signal BS can be provided as one input to digit AND gates 132. Another input to digit AND gates 132 can be a Y-select signal from Y-decoder circuit 130. In response to the various input signals, digit AND gates 132 can generate column select signals that are received by column switch circuit 106. According to the column select signal, a column switch circuit can select a particular digit line pair. A digit AND gate 132 can also generate an equalization signal EQ that is provided to precharge/equalization circuit 104. In response to the equalization signal EQ, precharge/equalization circuit 104 can precharge digit line pairs or "release" such digit line pairs from the precharge/equalized state.

A sense amplifier enable signal SE can activate a sense amplifier circuit 116. A write amplification activation signal WA can activate a write amplifier circuit 114.

Having described various components of a SRAM 100 according to one embodiment, various components that may be used in the SRAM 100 will now be described in more detail.

Figure 2:
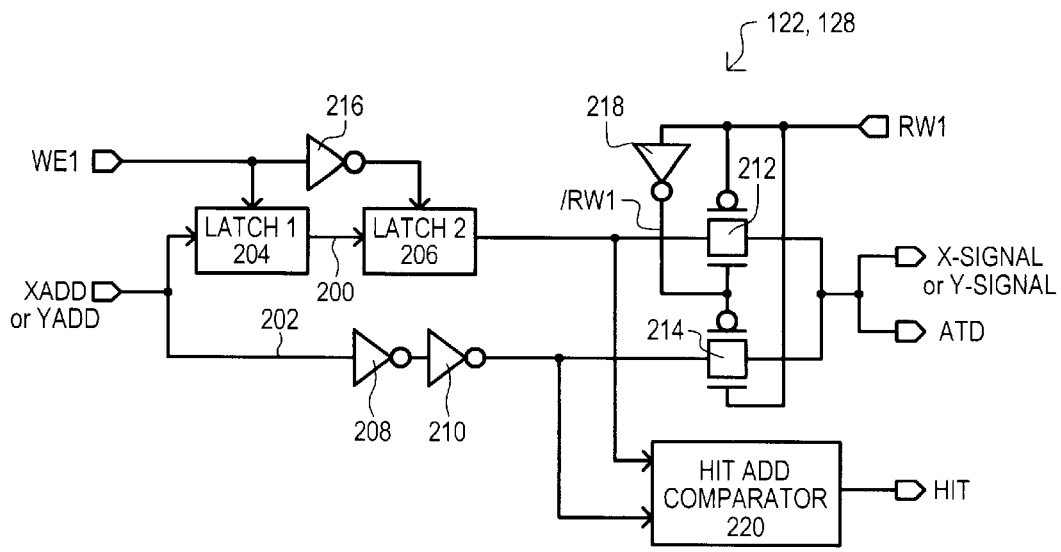
FIG. 2 is a circuit diagram showing an address register that may be used in the embodiment of FIG. 1.

In particular embodiments, X-address registers 122 and Y-address registers 128 can have the same structure. One such address register is shown in FIG. 2, and is designated by the general reference characters 122, 128.

An address register (122, 128) may include a write path 200 and a read path 202. A write path 200 may include a first latch 204 and second latch 206 arranged in series. A read path 202 may include a first buffer 208 and second buffer 210 arranged in series. A write path 200 value can be output by way of a first gate 212, while a read path 202 value can be output by way of a second gate 214.

First and second latches (204 and 206) may be controlled by an internal write enable signal WE1. In particular, first latch 204 can receive the internal write enable signal WE1, while second latch 206 can receive the internal write enable signal by way of an inverter 216. Thus, when the internal write enable signal WE1 has one value, a first latch 204 may have a "through" state while a second latch 206 may have a "latching" state. Conversely, when the internal write enable signal WE1 has another value, a first latch 204 may have the latching state while a second latch 206 may have the through state. In one arrangement, when a latch is in the through state, data at its input can pass through the latch and be provided as an output. When a latch is in the latching state, data is latched in the latch and provided as an output value, and changes at the latch input do not affect the latched value.

First and second gates (212 and 214) may be controlled by read/write switch signal RW1. In particular, when read/write switch signal RW1 has one value, first gate 212 can be enabled, and when read/write switch signal RW1 has another value, second gate 214 can be enabled. Because the first and second gates (212 and 214) of the embodiment of FIG. 2 are complementary metal(conductor)-oxide (insulator)-semiconductor (CMOS) transfer gates, an inverter 218 is included to generate complementary read/write switch signals RW1 and /RW1. The output from first or second gates (212 or 214) can be an ATD output and an input to an address decoder.

An address register (122, 128) may further include a hit address comparator 220 having one input connected to the write path 200 and another input connected to the read path 202. When the inputs of the hit address comparator 220 match, a HIT output signal can be activated.

Figure 3:
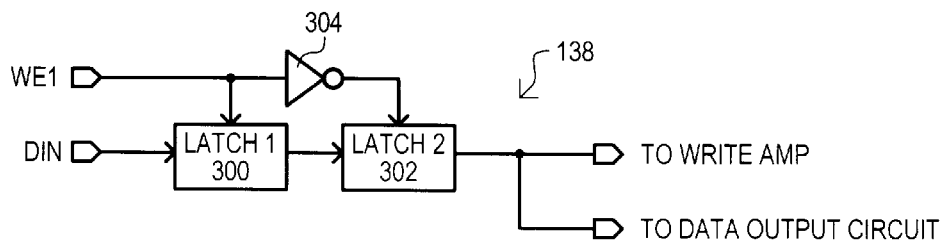
FIG. 3 is a circuit diagram showing a data register that may be used in the embodiment of FIG. 1.

An example of data register 138 that may be used in the embodiment of FIG. 1 is shown in FIG. 3. The data register 138 of FIG. 3 includes a first latch 300 and a second latch 302. The first and second latches (300 and 302) can be arranged in series, and receive an input data value DIN. The output of second latch 302 can be provided to both a write amplifier circuit and a data output circuit. A first latch 300 may be controlled by an internal write enable signal WE1. A second latch 302 may be controlled by an internal write enable signal inverted by an inverter 304. In this arrangement, when the internal write enable signal WEI has one value, a first latch 300 may have a "through" state while a second latch 302 may have a "latching" state. Then, when the internal write enable signal WE1 has another value, a first latch 300 may have the latching state while a second latch 302 may have the through state.

Having described the structure of an SRAM circuit 100 according to various embodiments, the operation of an SRAM circuit according to one embodiment will now be described.

Figure 4:
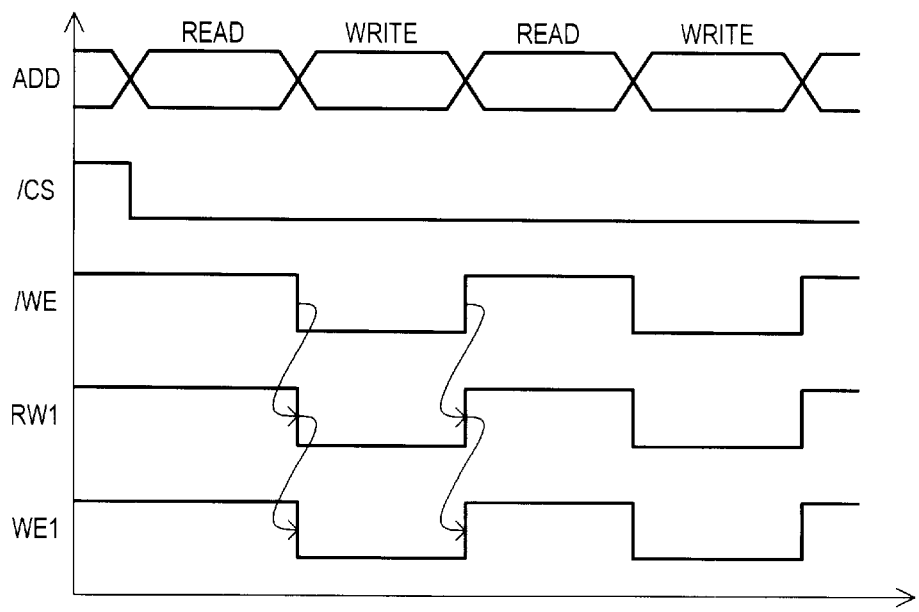
FIG. 4 is a timing diagram illustrating read and write operations for a SRAM circuit according to one embodiment.

Referring now to FIG. 4, a timing diagram is set forth illustrating read and write operations according to one embodiment. The operations of FIG. 4 will be described with reference to FIGS. 1–3. Initially, a read/write control circuit 140 can receive a chip select signal /CS and write enable signal /WE that are both inactive (high). With the write enable signal /WE inactive, the read/write switch signal RW1 is high and the internal write enable signal WE1 can be high.

A chip select signal /CS can then transition low while the write enable signal /WE is high, indicating a read operation. An address value ADD can transition, providing an address for the read operation. A memory cell from memory cell array 102 can be selected according to the applied address and output to a sense amplifier circuit 116 through column switch circuit 106. A sense amplifier circuit 116 can amplify read data which can be output to an I/O terminal 120 by way of output circuit 118.

With a chip select signal /CS low, the write enable signal WE1 can then transition low indicating a write operation. An address value ADD can transition, providing an address for the write operation. With a write enable signal /WE low, the read/write switch signal RW1 and the internal write enable signal WE1 can both be low.

Within address registers (122, 128), because the internal write enable signal WE1 is low, a first latch 204 can be in a through state while second latch 206 can be in a latching state. Thus, received address values can be present in a first latch 204, while a second latch 206 can output a previously latched address value.

Further, with the read/write switch signal RW1 low, first gate 212 can be enabled while a second gate 214 can be disabled. In such an arrangement, the address value previously latched in the second gate 214 can be output to an address decoder circuit (124 or 130) and ATD circuit 134.

Within data register 138, because internal write enable signal WE1 is low, a first latch 300 can be in a through state while second latch 302 can be in a latching state. Thus, a received data write value can be present in a first latch 300, while second latch 302 outputs a previously latched data value.

A write enable signal /WE may then return high. Consequently, the internal write enable signal WE1 and read/write switch signal RW1 can transition high.

Within address registers (122, 128), because the internal write enable signal WE1 is high, a first latch 204 can be in a latching state while second latch 206 can be in through state, outputting the address value stored in the first latch 204. With the read/write switch signal RW1 high, first gate 212 can be disabled while a second gate 214 can be enabled.

Thus, an address value previously latched during a write operation is prevented from being output from the address register (122, 128). Instead, a currently supplied read address value can be output by way of second gate 214.

Within data register 138, because the internal write enable signal WE1 is high, first latch 300 can be in a latching state while second latch 302 can be in a through state. Thus, a previously received data value can be output from a second latch 302. However, because a read operation is currently taking place, a write amplifier is disabled and data provided by data register 138 is not written into a memory cell array 102.

Figure 5:
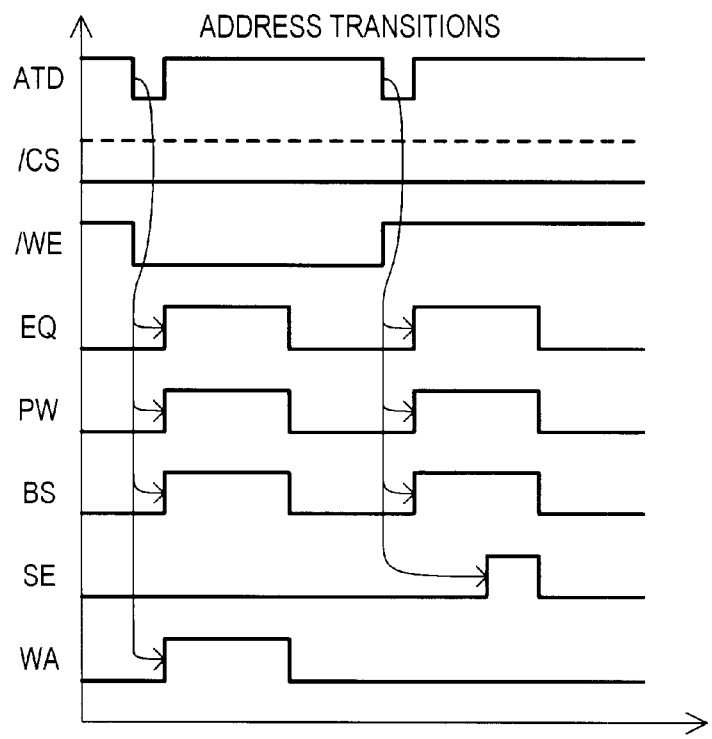
FIG. 5 is a timing diagram illustrating the generation of internal timing signals when address transitions occur according to one embodiment.

Referring now to FIG. 5, a timing diagram is set forth illustrating a write operation followed by a read operation that includes a change in address. The operations of FIG. 5 will be described with reference to FIGS. 1–3. Initially, an applied address value can make a transition while the write enable signal /WE and chip select signal /CS are both active (low in this example), indicating a write operation. Address values, in the form of ATD outputs from address registers (122, 128), can be provided to ATD circuit 134. In response to a change in at least one address bit value, ATD circuit 134 can generate a pulse, shown as a low-going ATD pulse in FIG. 5. An ATD pulse can be a "one-shot" pulse, as but one example.

An ATD pulse can result in the generation of an equalization signal EQ pulse, a pulse word signal PW pulse, a block select signal BS pulse, and a write amplifier activation signal WA pulse. It is noted that because the write enable signal /WE is active, a sense amplifier signal SE pulse is not generated. In one particular arrangement, the various pulses may be generated by circuits that receive the ATD pulse and extend its duration with delay circuits. In the case of a write amplifier activation WA signal, such a pulse may be enabled when the write enable signal /WE is low. In the case of a sense amplifier enable signal SE, such a pulse may be enabled when the write enable signal /WE is high.

An equalization signal EQ pulse (high-going in this example) can release digit lines from a precharged/equalized state and thereby allow data to be written into a memory cell. A pulse word signal PW pulse, when logically ANDed with an X-select signal from X-decoder circuit 124, can activate a word line, thereby selecting a row of memory cells. A block select signal BS pulse, when logically ANDed with a Y-select signal from Y-decoder circuit 130, can result in column switch circuit 106 selecting a digit line pair from the selected row of memory cells. A write amplifier activation signal WA pulse can activate write amplifier circuit 114, which can amplify received write data, thereby writing the data into the selected memory cell. In this way a memory cell can be selected for writing.

Next, in the example of FIG. 5, a second address transition can occur while the write enable signal /WE is inactive (high) and the chip select signal is active (low), indicating a read operation. Operations may proceed in the same general way as a write operation described above, however a write amplifier activation signal WA is not activated and instead the sense amplifier enable signal SE is activated. With the sense amplifier enable signal SE activated, a sense amplifier circuit 116 can amplify data from the selected digit line pair, and output it by way of output circuit 118.

Figure 6:
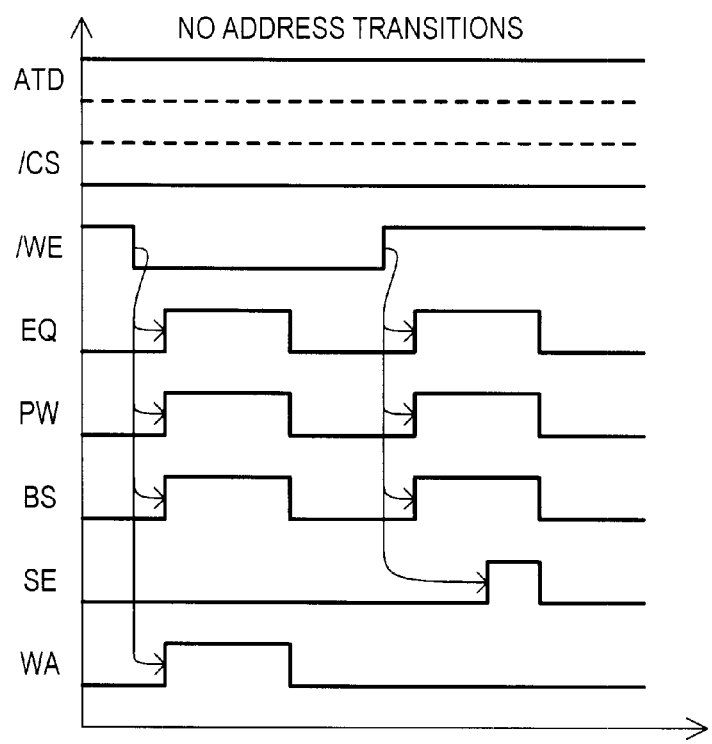
FIG. 6 is a timing diagram illustrating the generation of internal timing signals when address transitions do not occur according to one embodiment.

Referring now to FIG. 6, a timing diagram is set forth illustrating write operation followed by a read operation where a change in address does not occur. Because no change in address occurs, no ATD pulse is generated. However, as will be recalled, a read/write control circuit 140 can generate a main pulse signal MP. More particularly, a read/write control circuit 140 can provide a main pulse signal MP to internal pulse generating circuit 142 in response to transitions in a write enable signal /WE. Further, in the event an ATD pulse is not generated the main pulse signal MP can be used to generate the various timing signals described in conjunction with FIG. 5.

That is, in the absence of an ATD pulse, a main pulse signal MP pulse can result in the generation of an equalization signal EQ pulse, a pulse word signal PW pulse, a block select signal BS pulse, and a write amplifier activation signal WA pulse. It is noted that like the ATD pulse case, because the write enable signal /WE is active, a sense amplifier signal SE pulse is not generated. As in the case of the operations discussed in conjunction with FIG. 5, the various pulses may be generated by circuits that receive the MP pulse and include delay circuits to increase the duration of such a pulse. Such circuits may be disabled when an ATD pulse is detected. Of course numerous other interlocking and logic circuit arrangements can generate the desired result.

Figure 7:
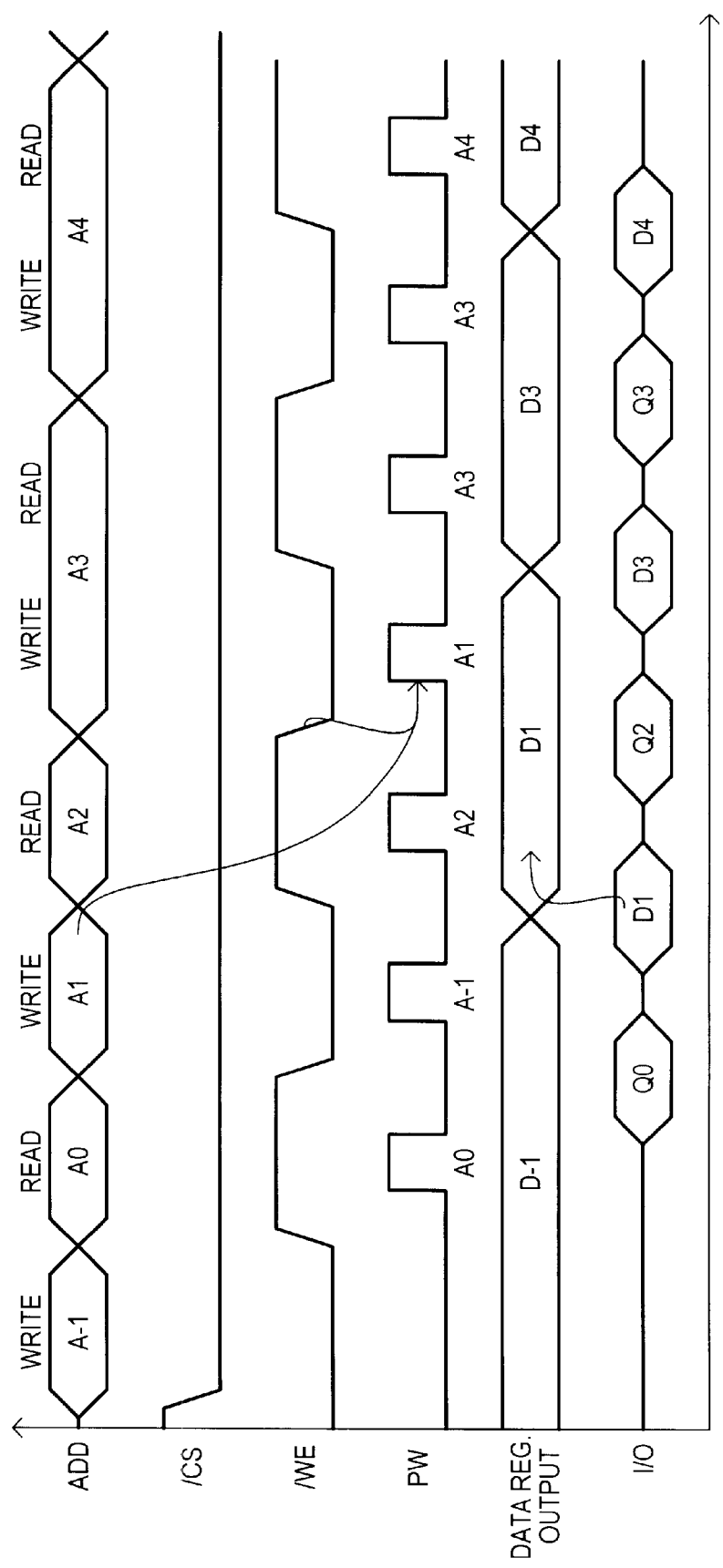
FIG. 7 is a timing diagram illustrating read and write operations according to one embodiment.
Figure 8:
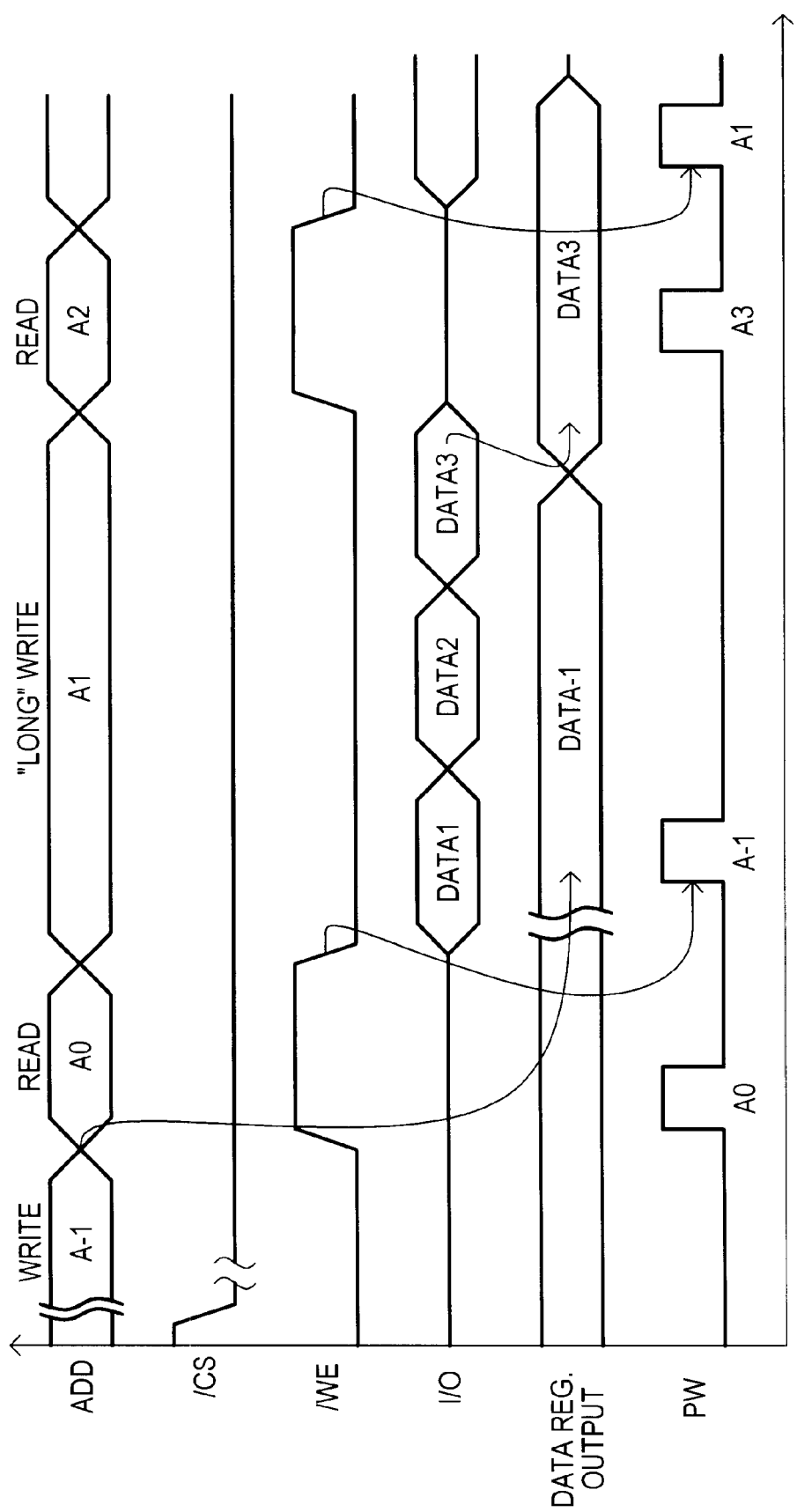
FIG. 8 is a timing diagram illustrating read and write operations, including a "long" write operation according to on e embodiment.

Having described the generation of timing signals for when address transitions occur and do not occur, read and write operations according to one embodiment are further detailed in FIGS. 7 and 8.

Referring now to FIG. 7, various read and write operations are illustrated. As shown in FIG. 7, an address value can transition from a value "A-1" to a value "A0." In addition, a chip select signal /CS can be active (low) while a write enable signal /WE can be inactive (high), indicating a read operation.

As previously discussed, within address registers (122, 128), a read address can propagate along a read path 202 to a corresponding X- or Y-address decoder circuit (124 or 130). The transition in address (A-1 to A0) results in the ATD circuit 134 generating an ATD pulse. An ATD pulse can be received by an internal pulse generator circuit 142 and generate a pulse word signal PW pulse, a block select signal BS pulse, and a sense amplifier enable signal SE pulse. A digit AND gate 132 can generate a precharge/equalization signal EQ pulse. In this way a data value Q0 can be amplified by a sense amplifier circuit 116 and output to I/O terminal 120 by way of output circuit 118.

Referring once again to FIG. 7, a "delayed" write aspect according to one embodiment is also illustrated. Following the read operation for address A0, the address makes another transition to address A1. With a chip select signal /CS still active, a write enable signal /WE can be activated (transition low), indicating a write operation.

As previously discussed, within address registers (122, 128), a write address can be received by first latches 204, which are in a "through" state. Thus, the write address value is not immediately applied to corresponding X- and Y-decoder circuits (124 or 130). The transition in address (A0 to A1) results in the ATD circuit 134 generating an ATD pulse, which in turn generates PW, BS, EQ and WA pulses. However, the write amplifier activation signal WA pulse writes previously latched data, and not currently received write data D1.

When the write enable signal /WE returns high, address values A1 can be latched in corresponding second latches 206 within address registers (122, 128). However, because the read/write switch signal RW1 remains high, such address values are still not applied to X-and Y-decoder circuits (124 or 130). Further, the rising /WE edge can result in data register 138 latching write data D which is present at I/O terminal 120. Also at this time, as shown in FIG. 7, another read operation can read data Q2 corresponding to read address A2.

A write enable signal /WE can return low once again. It is on this subsequent write operation that previously latched write address value A1 can be applied to X- and Y-address decoders (124 and 130), and previously latched write data D1 can be applied to write amplifier circuit 114. The corresponding transition in address (A2 to A3) can generate the ATD, PW, BS, WA and EQ pulses involved in writing write data D1 to a memory cell selected by write address A1.

In this way, one embodiment can provide a delayed write operation by latching write address and write data values at the conclusion of a write enable pulse, and performing the actual writing of data on a subsequent write enable pulse.

FIG. 7 also illustrates how latched write data can be provided as read data before the latched write data has been written to a memory cell. Such an operation may occur where a write operation to an address is followed by a read operation to the same address.

Referring once again to FIG. 7, it is shown that following the application of the address "A2" the address makes another transition to address "A3." In addition, the write enable signal /WE transitions low, indicating that write data D3 is to be written to address A3. As described above, the write operation is delayed. Thus, when the write enable signal /WE returns high, the write address A3 is latched in address registers (122, 128) and write data D3 is latched in data register 138.

As further shown in FIG. 7, the address is maintained at the value A3, but the write enable signal /WE returns high, indicating a read operation to the same address. Conventionally, such an operation might result in erroneous data as the write data D3 has not yet been written to the memory cell at address A3 (it is still latched in data register 138). Further, in some conventional approaches, because no address transition has occurred, timing signals might not be generated.

However, it will be recalled that address registers (122, 128) can include hit address comparators 220. Hit address comparators 220 can thus indicate when a newly applied read address received on read paths 202 is the same as a previously latched write address output along write paths 200. Such "hit" values can be logically ANDed in hit AND gate 136. If all hit values are active, the write data stored in a data register 138 can be output through output circuit 118.

In this way, one embodiment can provide stored write data as read data before the write data has been written to a memory cell.

FIG. 8 shows a "long" write operation according to one embodiment. In a long write operation, input data values can transition one or more times while the write enable signal /WE is active (low). As will be recalled, in a conventional pulse word type SRAM circuit, a long write operation can result in multiple pulse word signals, causing memory cells of a selected word line to be connected to their corresponding digit line pairs multiple times. This can consume current, and in the case of four transistor (4-T) memory cells, may result in corruption of data.

However, as shown in FIG. 8, the present invention can eliminate such drawbacks by having a single delayed write operation at the end of a write enable signal /WE pulse. More particularly, in FIG. 8 an address can transition from a value A0 to value A1. The write enable signal /WE can also be active (low) at this time. Further, because a "long" write operation occurs, I/O terminal 120 can make three transitions (from DATA1 to DATA2 to DATA3) before the write operation is terminated. As will be recalled, the present invention can generate a control pulse signal at the start of a write operation (either due to an address transition or write enable signal /WE transition) and at the end of a write operation (either due to an address transition, or write enable signal /WE transition). However, during the write operation (i.e., while /WE remains active) such pulses are not generated. Consequently, if a long write operation occurs, only the write data present at the end of the write operation can be latched. This data may then be subsequently written in a late write operation, as previously described.

It is noted that while the above embodiments have described asynchronous SRAM circuits, alternate embodiments may include synchronous SRAM circuits that receive an external timing signal. In such a case, in a write operation, a write address value and write data value may be latched on a particular transition in the timing signal (e.g., a rising CLK edge). On a subsequent write operation, the latched write data value may be written into a memory cell selected according to the latched write address. It is noted that while two cycles may be required between write operations, one cycle may be used to write latched data. Therefore, the data and address buses may be used efficiently.

Further, a synchronous SRAM circuit according to an alternate embodiment could also take advantage of the "hit" circuitry disclosed. Namely, on one clock cycle a write address and write data can be latched. If a read operation is performed to the same address on the next cycle, the latched write data can be output as the read data.

It is also noted that while the embodiments were initially described as including 6-T memory cells, alternate embodiments could include "true" 4-T memory cells. In particular, word line pulses (formed by ANDing a pulse word signal PW and an X-decoder circuit output, for example) may be short enough to enable de-selected memory cells to retain their data. Thus, while a de-selected memory cell may be connected to a digit line at a relatively low potential in a write operation, such a connection may be sufficiently short so as to not destroy any stored data.

Still further, alternate embodiments of the present invention could include pulse word approaches with 4-T memory cells. That is, an embodiment could include various circuit parts shown in FIG. 1, but not include latches for write data and a write address. Instead, write data and write addresses could flow through as in the case of a read operation in FIG. 1. It is not believed that conventional approaches have included such an arrangement with 4-T cells. Again, timing pulses (e.g. a write amplifier activation pulse) could be sufficiently small so as to prevent data in de-selected memory cells from being destroyed.

According to the various disclosed embodiments, a SRAM circuit may be an asynchronous SRAM that generates timing signals internally, and not in response to an external synchronous signal. Such a SRAM circuit can include a "late" write operation that latches data during one write cycle and then writes the latched data to memory cells in a subsequent write cycle. In this way, if the applied write data undergoes various transitions during a write cycle, only the last write data will be latched. This can prevent unnecessary memory cell selection that can occur in conventional pulse word arrangements. Such unnecessary memory cell selection can result in higher current consumption.

The embodiments further disclose arrangements where write data to a SRAM circuit can be latched in a write operation to a particular address. Then, if a read operation is subsequently performed to the same address, the latched write data can be provided as read data.

The embodiments further disclose SRAM circuits that may include a pulse word system with a memory cell array that includes "true" 4-T memory cells. By controlling timing pulse lengths, data can be written to, and read from, the 4-T memory cells without destroying data in de-selected memory cells, as can be the case in some conventional approaches.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A static random access memory (SRAM) circuit, comprising:

a plurality of SRAM cells that can be selected according to an internal pulse signal that is not generated in response to an external periodic timing signal; and an address register circuit that can store a write address value during one write operation and output the stored write address during a subsequent write operation.

2. The SRAM circuit of claim 1, further including:

a data register circuit that can store write data during one write operation and output the stored write data during a subsequent write operation.

3. The SRAM circuit of claim 1, further including:

the SRAM cells are selected according to a n applied address; and an internal pulse generator provides the internal pulse signal in response to transitions in the applied address.

4. The SRAM circuit of claim 3, wherein :

the internal pulse generator provides the internal pulse signal in response to transitions in a write enable signal when the applied address remains the same.

5. The SRAM circuit of claim 1, further including:

the SRAM cells are selected according to an applied address and include rows of SRAM cells each commonly coupled to a word line;

an X-address decoder that generates X-select signals corresponding to particular combinations of at least a portion of the applied address; and a word line is selected in response to the internal pulse signal and at least one X-select signal.

6. The SRAM circuit of claim 1, further including:

the SRAM cells are selected according to an applied address and include columns of SRAM cells each commonly coupled to at least one digit line;

a Y-address decoder that generates Y-select signals corresponding to particular combinations of at least a portion of the applied address; and a column switch circuit that selects at least one digit line in response to the internal pulse signal and at least one Y-select signal.

7. The SRAM circuit of claim 1, further including:

the SRAM cells are selected according to an applied address; and an address compare circuit that activates a hit signal when an applied address value matches the address values stored in the address register circuit.

8. The SRAM circuit of claim 7, further including:

a data register circuit that can store write data during one write operation and output the stored write data during a subsequent write operation; and an output circuit that provides a memory cell value as an output when the hit signal is inactive and provides the stored write data as an output when the hit signal is active.

9. The SRAM circuit of claim 1, wherein:

the SRAM cells include two driver transistors that drive complementary nodes to different potentials and two access transistors that couple the complementary nodes to a digit line pair.

10. The SRAM circuit of claim 9, wherein:

the SRAM cells further include two load devices coupled between the complementary nodes and a predetermined potential.

11. A static random access memory (SRAM) circuit, comprising:

a plurality of address registers that store a write address value in one write operation and output the stored write address value in a subsequent write operation, each address register includes a first address latch in series with a second address latch;

a control circuit that generates an internal write enable signal in response to an external write enable signal; and the first address latch is placed in a through state and the second address latch is placed in a latching state when the internal write enable signal has a first value, and the first address latch is placed in the latching state and the second address latch is placed in the through state when the internal write enable signal has a second value.

12. The SRAM circuit of claim 11, further including:

a compare circuit that compares the stored write address value with an applied read address value and generates a hit indication when the stored write address value matches the applied read address value.

13. The SRAM circuit of claim 11, further including:

at least one data register that stores a write data value in one write operation and outputs the stored write data value in a subsequent write operation.

* * * * *